US009419121B1

(12) United States Patent
Teo et al.

(10) Patent No.: US 9,419,121 B1
(45) Date of Patent: Aug. 16, 2016

(54) SEMICONDUCTOR DEVICE WITH MULTIPLE CARRIER CHANNELS

(71) Applicant: Mitsubishi Electric Research Laboratories, Inc., Cambridge, MA (US)

(72) Inventors: Koon Hoo Teo, Lexington, MA (US); Yuhao Zhang, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/841,940

(22) Filed: Sep. 1, 2015

Related U.S. Application Data

(60) Provisional application No. 62/193,673, filed on Jul. 17, 2015.

(51) Int. Cl.
| H01L 29/778 | (2006.01) |
| H01L 29/20 | (2006.01) |
| H01L 29/205 | (2006.01) |
| H01L 29/423 | (2006.01) |
| H01L 29/417 | (2006.01) |
| H01L 29/40 | (2006.01) |
| H01L 29/66 | (2006.01) |

(52) U.S. Cl.
CPC ........ *H01L 29/7784* (2013.01); *H01L 29/2003* (2013.01); *H01L 29/205* (2013.01); *H01L 29/404* (2013.01); *H01L 29/41758* (2013.01); *H01L 29/4238* (2013.01); *H01L 29/66431* (2013.01); *H01L 29/66462* (2013.01); *H01L 29/778* (2013.01); *H01L 29/7781* (2013.01); *H01L 29/7782* (2013.01); *H01L 29/7783* (2013.01); *H01L 29/7788* (2013.01); *H01L 29/7789* (2013.01)

(58) Field of Classification Search
None
See application file for complete search history.

(56) References Cited

U.S. PATENT DOCUMENTS

| 7,838,905 | B2 | 11/2010 | Brar et al. | |
| 8,441,030 | B2* | 5/2013 | Beach | H01L 29/2003 257/107 |
| 8,907,378 | B2* | 12/2014 | Teo | H01L 29/2003 257/194 |
| 9,035,355 | B2 | 5/2015 | Ostermaier et al. | |
| 2002/0185655 | A1* | 12/2002 | Fahimulla | B82Y 10/00 257/192 |
| 2014/0091310 | A1 | 4/2014 | Jeon et al. | |
| 2014/0091366 | A1 | 4/2014 | Jeon et al. | |
| 2014/0332822 | A1* | 11/2014 | Takeya | H01L 29/7787 257/76 |

OTHER PUBLICATIONS

R. S. Pengelly, S. M. Wood, J. W. Milligan, S. T. Sheppard, and W. L. Pribble, "A Review of GaN on SiC High Electron-Mobility Power Transistors and MMICs," IEEE Transactions on Microwave Theory and Techniques, vol. 60, No. 6, pp. 1764-1783, Jun. 2012.

(Continued)

*Primary Examiner* — Minh-Loan Tran
(74) *Attorney, Agent, or Firm* — Gene Vinokur; James McAleenan; Hironori Tsukamoto (57) ABSTRACT

A semiconductor device includes a layered structure forming multiple carrier channels extending in parallel at different depths of the semiconductor device and a gate electrode having multiple gate fingers of different lengths penetrating the layered structure to reach and control corresponding carrier channels at the different depths. The semiconductor device also includes a carrier electrode having multiple carrier fingers of different lengths penetrating the layered structure to access the corresponding carrier channels. The carrier fingers are interdigitated with the gate fingers.

20 Claims, 8 Drawing Sheets

(56) References Cited

OTHER PUBLICATIONS

R. Chu, Y. Zhou, J. Liu, A Wang, K. J. Chen, and K. M. Lau, "AlGaN-GaN double-channel HEMTs," Electron Devices, IEEE Transactions on, vol. 52, No. 4, pp. 438-446, 2005.

T. Palacios, A. Chini, D. Buttari, S. Heikman, A. Chakraborty, S. Keller, S. P. DenBaars, and U. K. Mishra, "Use of double-channel heterostructures to improve the access resistance and linearity in GaN-based HEMTs," IEEE Transactions on Electron Devices, vol. 53, No. 3, pp. 562-565, Mar. 2006.

X.-D. Wang, W.-D. Hu, X.-S. Chen, and W. Lu, "The Study of Self-Heating and Hot-Electron Effects for AlGaN/GaN Double-Channel HEMTs," IEEE Transactions on Electron Devices, vol. 59, No. 5, pp. 1393-1401, May 2012.

S. Karmalkar and U. K. Mishra, "Enhancement of breakdown voltage in AlGaN/GaN high electron mobility transistors using a field plate," Electron Devices, IEEE Transactions on, vol. 48, No. 8, pp. 1515-1521, 2001.

R. Chu, Y. Zhou, J. Liu, D. Wang, K. J. Chen, and K. M. Lau, "AlGaN-GaN double-channel HEMTs," Electron Devices, IEEE Transactions on, vol. 52, No. 4, pp. 438-446, 2005.

M. Nawaz and G. U. Jensen, "Simple analytical charge control model for multichannel GaAs/AlGaAs based high electron mobility transistors (HEMT)," in 1995 4th International Conference on Solid-State and Integrated Circuit Technology, 1995, pp. 512-514.

A. Kamath, T. Patil, R. Adari, I. Bhattacharya, S. Ganguly, R. W. Aldhaheri, M. A. Hussain, and D. Saha, "Double-Channel AlGaN/GaN High Electron Mobility Transistor With Back Barriers," IEEE Electron Device Letters, vol. 33, No. 12, pp. 1690-1692, Dec. 2012.

B. Lu, M. Sun, and T. Palacios, "An Etch-Stop Barrier Structure for GaN High-Electron-Mobility Transistors," IEEE Electron Device Letters, vol. 34, No. 3, pp. 369-371, Mar. 2013.

M. Hoi Wong, Y. Pei, R. Chu, S. Rajan, B. L. Swenson, D. F. Brown, S. Keller, S. P. DenBaars, J. S. Speck, and U. K. Mishra, "N-Face Metal #x2013;Insulator #x2013;Semiconductor High-Electron-Mobility Transistors With AlN Back-Barrier," IEEE Electron Device Letters, vol. 29, No. 10, pp. 1101-1104, Oct. 2008.

\* cited by examiner

SEMICONDUCTOR DEVICE WITH MULTIPLE CARRIER CHANNELS

RELATED APPLICATION

This application claims priority from a provisional application 62/193,673 filed on Jul. 17, 2015 and incorporated herein by reference.

FIELD OF THE INVENTION

The present invention relates generally to semiconductor device, and more particularly to semiconductor devices with multiple carrier channels.

BACKGROUND OF THE INVENTION

Semiconductor devices play a significant role in solving the energy challenges. Specifically, nitride power transistors have great potential in the application of advanced transportation systems, more robust energy delivery networks and many new revolutionary approaches to high-efficiency electricity generation and conversion. Those systems rely on very efficient converters to step-up or step-down electric voltages. Nowadays, these devices are mainly made of silicon (Si). However, the limited breakdown voltage and frequency response of Si, and its higher resistance make the commercial devices and circuits currently available very bulky, heavy and inappropriate for future power applications. As an alternative, gallium nitride (GaN) devices have achieved record combination of high-voltages, high frequency response and low on-resistances for power applications.

Currently, GaN power devices, such as the GaN-based high electron mobility transistors (HEMTs), are regarded as one of the most promising candidates for high-power, high-voltage and high frequency applications. GaN HEMTs have achieved up to 10 times higher power density of GaAs HEMTs with much larger breakdown voltage ($V_B$) and current density, as well as a high cut-off frequency of over 400 GHz. State-of-the-art power levels have been demonstrated on SiC substrates with total output powers of 800 W at 2.9 GHz and over 500 W at 3.5 GHz. However, for the high-power applications, such as high-power motors, a higher output power, i.e. 3-5 kW, is desired, which requires a further enhancement of output power of GaN power devices.

To achieve the high-power requirement for GaN power devices, the device current capability needs to be enhanced. For instance, in the GaN power devices used for amplifiers, such as the class A devices, the maximum output power can be derived as $$P_{out}^{max} = \frac{1}{8} I_{max}(V_{m,max} - V_k) \text{ where } V_{m,max}$$

is determined by the device breakdown voltage, $V_k$ is the knee voltage and $I_{max}$ is the maximum drain-source current. For GaN-based power devices, although the device breakdown voltage can increase with increasing gate-to-drain distance, the $I_{max}$ is currently limited by the transport capability of the single channel, where I saturates at high electric field due to the saturation of carrier mobility and velocity and the alleviated channel temperature.

The multichannel structures of GaAs-based and GaN-based HEMTs can be used to increase the device current density. In AlGaAs/GaAs HEMTs, the utilization of up to three channels with $2-3\times10^{12}$ cm$^{-2}$ electrons in each could achieve a high output current as ~1 A/mm. In AlGaN/GaN HEMTs, double-channel structures can not only enable a high output current, but also reduce the differential source access resistance for higher linearity and gain cutoff frequency.

However, the double-channel structure of HEMTs, although delivered a higher drain current density, can have large subthreshold swing, low threshold voltage, short-channel effects and non-linear gate transconductance, due to a weak gate control over the lower 2DEG channel. The weak gate control not only harms the benefits of double-channel device in current enhancement, but inhibits the development of multi-channel devices, as it is more difficult for gate to turn on or off more channels below the first channel.

One possible solution to the weak gate problem is to use a back-barrier to enhance the electron confinement for the dipper channels and the gate control. However, the transfer characteristics of the double-channel HEMTs with back-barrier are still much inferior to that of single-channel HEMTs.

Another solution provides spaced apart gate structures deeply etched to access the dipper channels. However, this solution sacrifices the gate width, making only ~½ gate width actually usable, which greatly reduced the effective current density (total current over total device width) and therefore loses the advantage of current enhancement brought by multi-channels. In some implementations, the current density of this exemplar multi-channel HEMTs can be even lower than the current density of single-channel devices. On the other hand, as current needs to aggregate into the regions between the spaced apart gates, current crowding and electric field crowding near the gate is inevitable, which would typically lead to high channel temperature, preliminary device breakdown and poor device reliability.

SUMMARY OF THE INVENTION

It is an objective of some embodiments of an invention to provide an interdigitated electrodes and/or electrode configuration forming a source, a drain, and gate stack for multi-channel semiconductor device, which could enable a direct gate access and control over each channel. It is another objective to provide such an electrode configuration that enables to take advantage of current enhancement by multi-channels without scarifying gate widths, while simultaneously enable a tight gate control for small subthreshold swings and fast channel responses. It is another objective of some embodiments to provide such an electrode configuration that can be applied to multi-channel devices with different kinds of channels, including but not limiting to two-dimensional-electron gas (2DEG), two-dimensional-hole gas (2DHG), metal-oxide-semiconductor (MOS) inversion n-channels and MOS inversion p-channels.

Some embodiments of the invention provide structures for semiconductor devices, such as transistors with multi-channels and interdigitated multi-finger electrodes of different depths, and a method to fabricate said multi-channel semiconductor devices. The structures and fabrication methods of different embodiments of the invention can be used in power electronics and microwave electronics, power amplification and digital electronics, among others.

Accordingly, one embodiment of the invention discloses a semiconductor device including a layered structure forming multiple carrier channels extending in parallel at different depths of the semiconductor device; a gate electrode having multiple gate fingers of different lengths penetrating the layered structure to reach and control corresponding carrier channels at the different depths; and a carrier electrode having multiple carrier fingers of different lengths penetrating the layered structure to access the corresponding carrier channels, wherein the carrier fingers are interdigitated with the gate fingers.

Another embodiment discloses a method for fabricating a semiconductor device. The method includes forming a layered structure enabling multiple carrier channels extending in parallel at different depths of the semiconductor device upon receiving a carrier charge; forming trenches in the layered structure for multiple fingers of a gate electrode and a carrier electrode, wherein the trenches for the fingers of the gate electrode and the carrier electrode are of different depths to access the corresponding carrier channels at the different depths; and forming the gate electrode and the carrier electrode such that the fingers of the carrier electrode are interdigitated with the fingers of the gate electrodes.

DETAILED DESCRIPTION OF THE PREFERRED EMBODIMENTS

Various embodiments of the invention relates to a semiconductor device with multi-channels structure and an electrode controlling the multi-channels, and the methods and techniques for fabricating the device. Merely by way of example, different embodiments can be applied to methods and systems for manufacturing semiconductor devices with multiple two-dimensional-electron (2DEG) channels and/or two-dimensional-hole (2DHG) channels. The methods and techniques can be applied to a variety of three-terminal semiconductor devices, including but not limiting to bipolar transistors, field-effect transistor, insulated-gate bipolar transistors (IGBTs), and thyristors to enable the control over multi-channels in the device. The principles employ by some embodiments of the invention can be also used to form and/or fabricate the multi-channel field effect transistor (FET).

Figure 1:
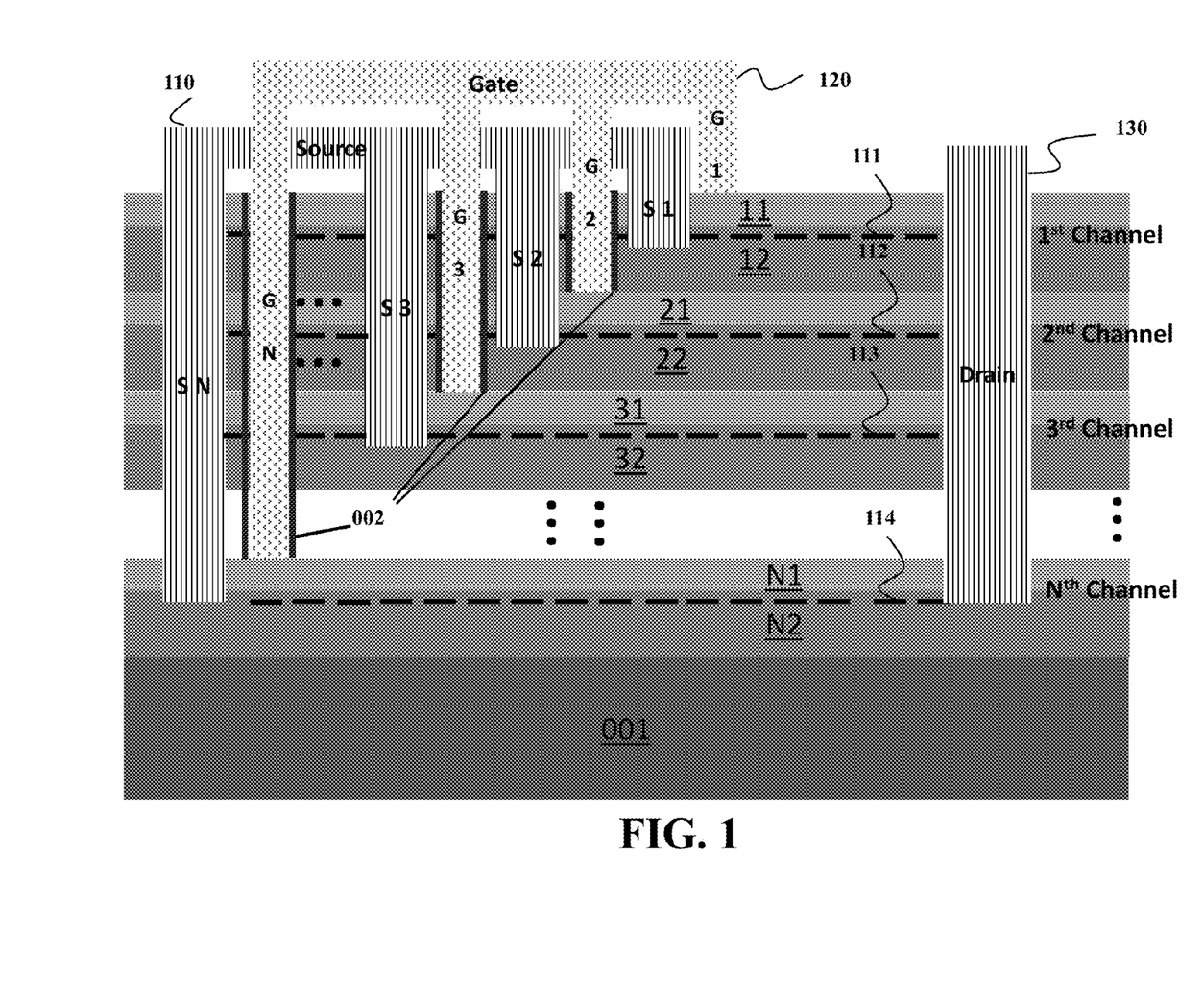
FIG. 1 is a simplified cross-sectional diagram of a semiconductor device according to one embodiment of the invention.

FIG. 1 shows a simplified cross-sectional diagram of a semiconductor device according to one embodiment of the invention. In this embodiment, the semiconductor device includes a layered structure forming multiple carrier channels extending in parallel at different depths of the semiconductor device. For example, the layered structure can be a multi-channel heterostructure FET with 2DEG and/or 2DHG channels, such as $1^{st}$ channel 111, $2^{nd}$ channel 112, $3^d$ channel 113, . . . $n^{th}$ channel. In some embodiment, the 2DEG and 2DHG channels can be formed by heterostructures including a pair of layers, i.e., a pair of layers 11 and 12, a pair of layers 21 and 22, a pair of layers 31 and 32 . . . , and a pair of layers N1 and N2. In each heterostructure, the material of the layers 11, 21, 31 . . . N1 has a different lattice constant compared to the material of the layers 12, 22, 32 . . . N2. For example, in one embodiment, materials of layer 11, 21, 31 . . . N1 and layer 12, 22, 32 . . . N2 is one or combination of indium aluminium gallium nitride InAlGaN and gallium nitride (GaN), aluminium gallium nitride (AlGaN) and GaN, or indium gallium nitride (InGaN) and GaN. In this embodiment, a 2DEG is formed in the $1^{st}$ channel, $2^{nd}$ channel, . . . $n^{th}$ channel.

The semiconductor device also includes a gate electrode 120 having multiple gate fingers G1, G2, G3 . . . GN of different lengths penetrating the layered structure to reach and control corresponding carrier channels at the different depths and a carrier electrode 110 also having multiple carrier fingers S1, S2, S3 . . . SN of different lengths penetrating the layered structure to access the corresponding carrier channels. The fingers of the carrier electrode are interdigitated with the fingers of the gate electrodes. The length and arrangement of the interdigitated fingers of the gate and the carrier electrodes are selected to form "stares-like" structure, in which the finger of the gate electrode controlling one channel, e.g., the channel 111, does not intersect the other channels.

Some embodiments of the invention are based on recognition that in some situations charge leakage between the carrier fingers and the gate fingers is possible due to interdigitated arrangement of the fingers. To address this concern, some embodiments deposit dielectric layers 002 all-round the sidewalls of each gate finger, to reduce leakage between the carrier fingers and the gate fingers.

For example, in embodiments, the carrier electrode 110 is a source stack with multiple source fingers S1, S2, S3 . . . SN for transmitting an electronic charge through carrier channels to a drain 130. In this example, the gate fingers arranged closer to the drain 130 have shorter length than the gate fingers arranged further from the drain. Similarly, the source fingers arranged closer to the drain 130 have shorter length than the source fingers arranged further from the drain. In such a manner, each of the channels 111, 112, 113, or 114 has an unobstructed path from the source to the drain.

Each source finger is of different length to access the multiple channels at different depths. In this description, the length of each finger is related to the depth the finger penetrates the layered structure, i.e., the greater the length of a finger than deeper the finger penetrate the structure to access the carrier channel extending at greater depth in the layered structure.

For example, each source finger forms or partially forms an Ohmic contact with corresponding carrier channel. A common drain electrode 130 can access multiple channels. The multiple gate fingers G1, G2, G3 . . . GN of the gate electrode are of different length to penetrate the semiconductor device at different depths to reach corresponding channels. For example, the G1, G2, G3 . . . GN can either sit on the top surface of the corresponding layer 11, 21, 31 . . . N1, or partially extend into the layer 11, 21, 31 . . . N1, forming a Shottky contact between metal, e.g., metal of the gate electrode, and semiconductor.

In one embodiment, the distances between bottom of each gate finger and each corresponding carrier channel are different to enable a different threshold voltage for each carrier channel. For example, in a AlGaN/GaN HEMTs, the 2DEG density is dependent on the AlGaN layer thickness on top of 2DEG. If the bottom of gate is shorter from 2DEG, which means that the AlGaN layer is thinner on top of 2DEG at the gate region, the 2DEG density is lower and therefore the threshold voltage is higher.

The semiconductor device can also include a substrate region 001. The region 001 can be a single layer or include multiple layers, with the material of one or more layers of the region 001 including but not limiting to semiconductors, dielectrics, polymers and conductors, etc. Multiple channels are formed in the said FET, with the carriers being either electrons or holes. Each channel in the said FET can be formed from different mechanisms, including but not limiting to p-n junction (junction FET), metal-oxide-semiconductor structure (MOS-FET), heterostructure (heterostructrue FET) and surface structure. The semiconductor regions forming each channel can include a single-layer (e.g. for surface channels), two layers or multiple layers, with the materials including but not limiting to compound semiconductor, diamond, two-dimensional materials such as graphene, $MoS_2$, BN, $NbSe_2$ etc.

Figure 2:
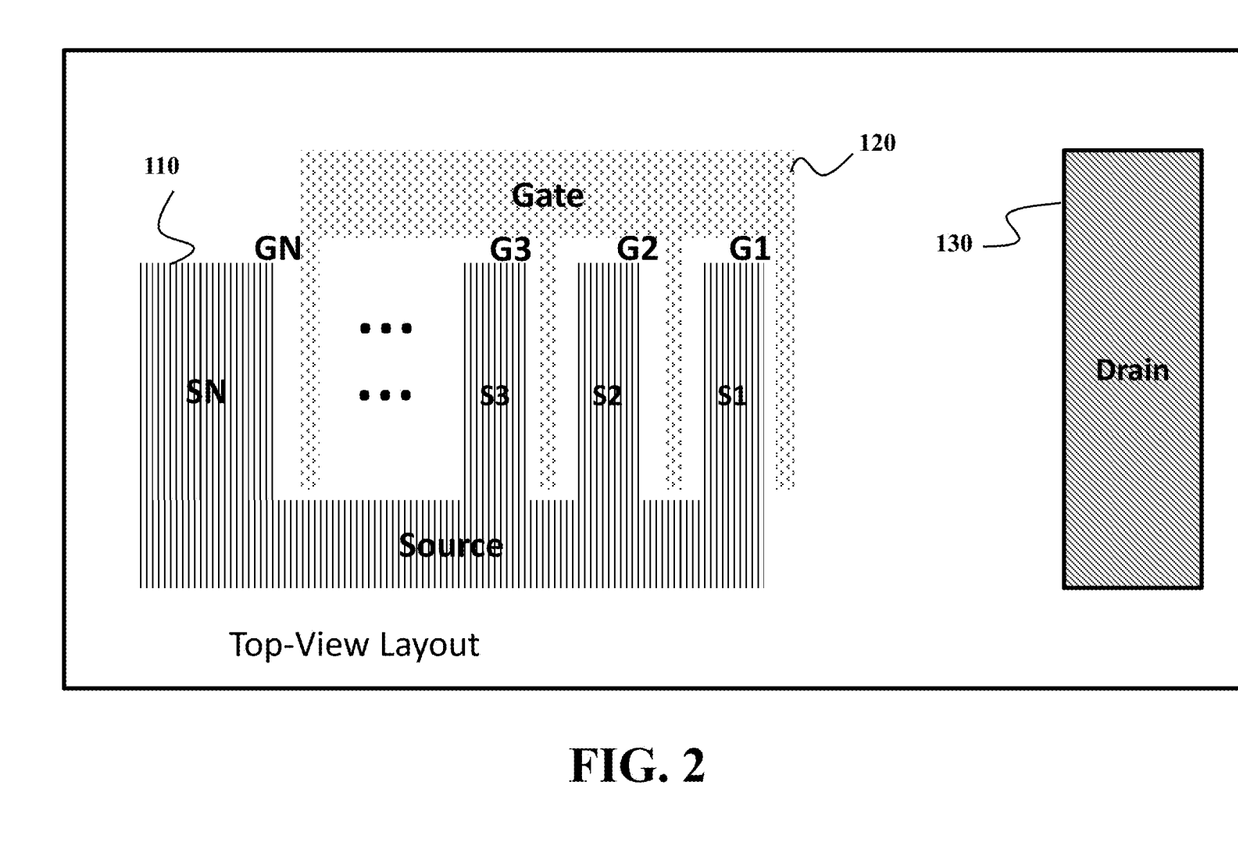
FIG. 2 is a top-view diagram illustrating electrode geometry and arrangement of the semiconductor device shown in FIG. 1.

FIG. 2 shows a top-view diagram illustrating the electrode geometry and arrangement of a multi-channel heterostructure FET with interdigitated gate and source fingers shown in FIG. 1 according to one embodiment of the invention. As shown, the gate fingers and source fingers are interdigitated, with a large gate pad and source pad connecting multiple source and gate fingers. With this electrode configuration, the channel width is equal to that of interdigitated gate/source fingers. In some embodiments, the source electrode and the drain electrode can be interchanged, i.e., the gate fingers can interdigitate with the drain fingers.

Figure 3:
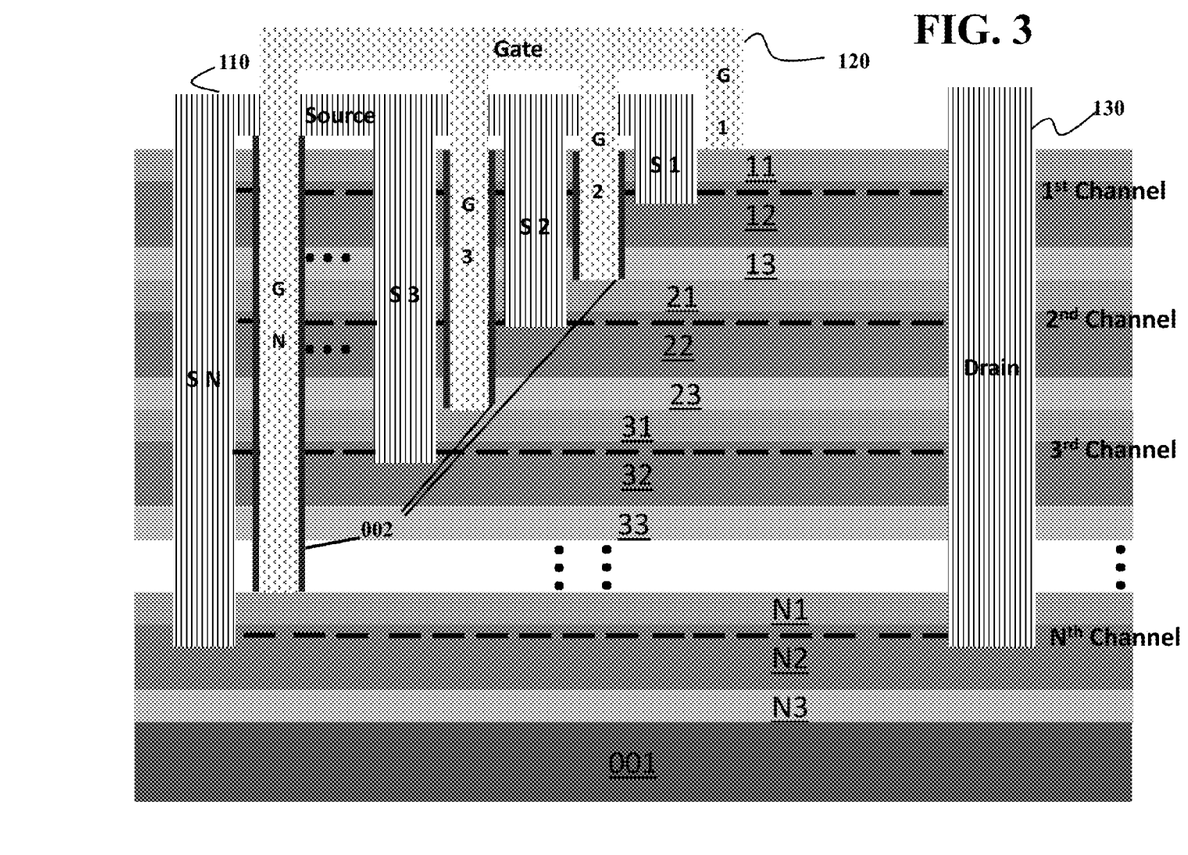
FIG. 3 is a schematic cross-sectional diagram illustrating a multi-channel heterostructure semiconductor device with additional layers according to one embodiment of the invention.

FIG. 3 shows a schematic cross-sectional diagram illustrating a multi-channel heterostructure FET with additional layers according to one embodiment of the invention. For example, the additional layers 13, 23, 33 . . . N3 can be disposed below the layers 12, 22 . . . N2 to enable an etch stop at the top surface of the layers 21, 31 . . . N1 during the gate trench formation. Additionally or alternatively, the layers 13, 23, 33 . . . N3 can assist the heat dissipation for each channel. In these embodiments, the materials of the layers 13, 23 . . . N3 can have a large thermal conductivity than the material of the layers 12, 22 . . . N2. In some other embodiments, the layers 13, 23, 33 . . . N3 can serve as back-barriers to enhance the electron/hole confinement in the channel. In these embodiments, the materials of the layers 13, 23 . . . N3 can have a larger bandgap than the layers 12, 22 . . . N2.

In one embodiment, the layered structure includes layers 11, 21, 31 . . . N1 and layers 12, 22 . . . N2 made of Aluminium gallium nitride (AlGaN) and/or Gallium nitride (GaN) material to form the heterostructure. Also, the layered structure includes additional layers of Aluminium nitride (AlN) serving as back-barrier layers 13, 23, 33 . . . N3. In this embodiment, the AlN back-barriers can enable an etch stop at AlN/AlGaN interface by a fluorine-based highly selective dry etching process, and also serves as a back-barrier to enhance the 2DEG confinement.

Figure 4:
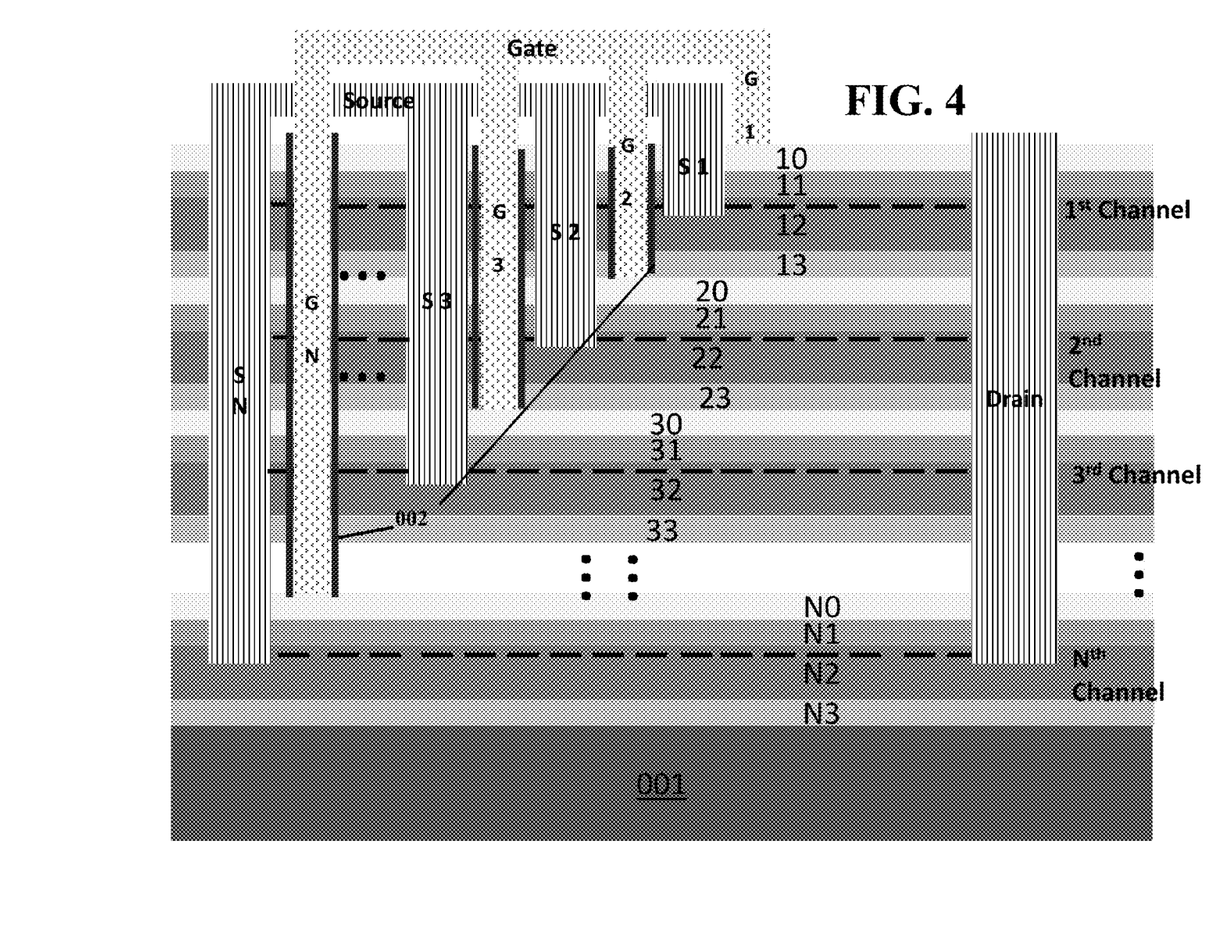
FIG. 4 shows a schematic cross-sectional diagram of a multi-channel heterostructure semiconductor device having back-barriers layers according to one embodiment of the invention.

FIG. 4 shows a schematic cross-sectional diagram of a multi-channel heterostructure FET with back-barriers, gate dielectric layers and interdigitated gate and source fingers according to one embodiment of the invention. In this embodiment, in addition to the sidewall dielectric layer 002, additional dielectric layers 10, 20 . . . N0 are disposed on the top surface of the layers 11, 21 . . . N1, to form a metal-insulator-semiconductor (MIS) or a MOS gate stack. The materials of layers 10, 20 . . . N0 can include but are not limited to $SiO_2$, $Si_xN_y$, $Si_xO_yN_zH_w$, $Al_2O_3$, $HfO_2$, etc. In some other embodiments, the dielectric layers 10, 20 . . . N0 are used as passivation layers to remove possible interface states between semiconductor layers.

Figure 5:
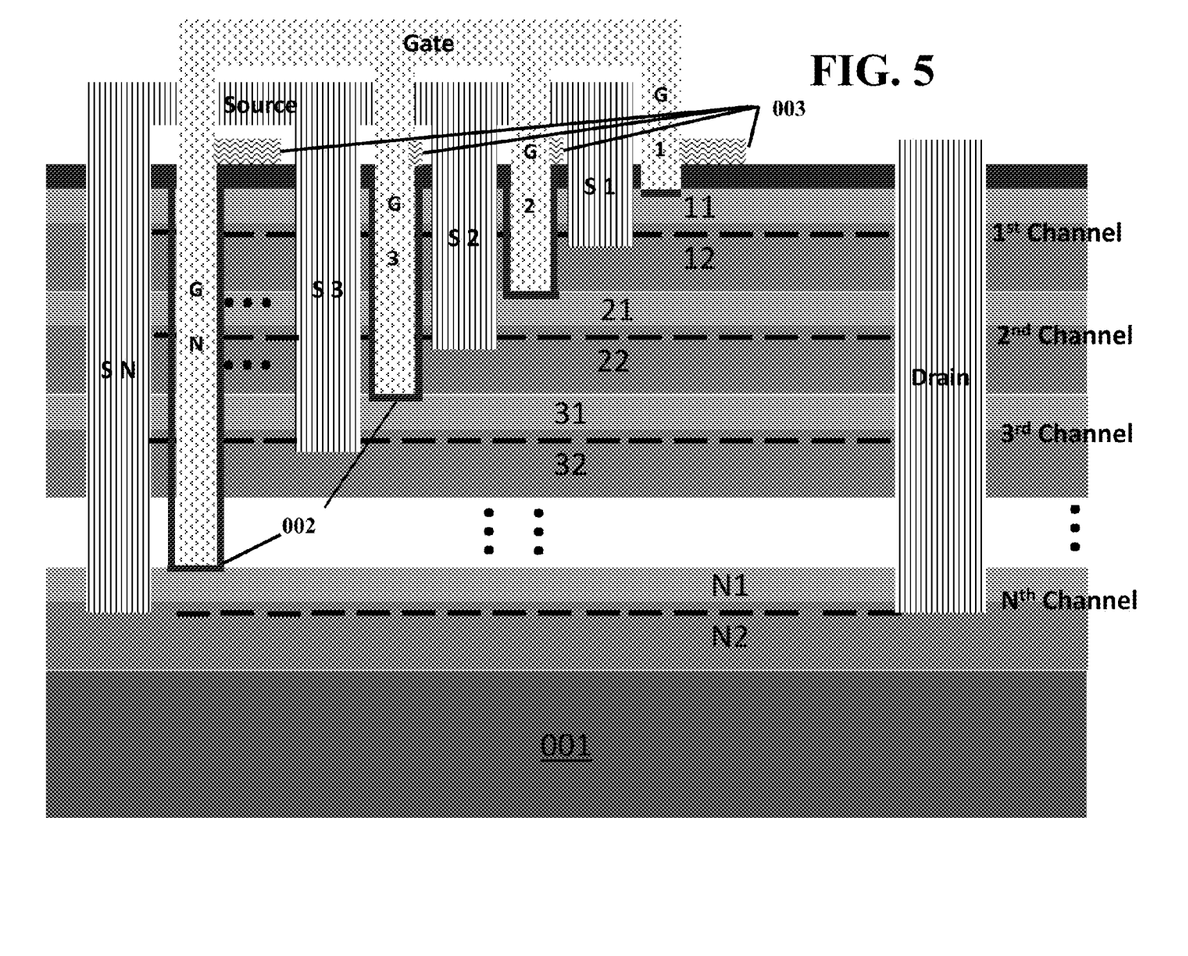
FIG. 5 is a schematic cross-sectional diagram of a semiconductor device according to one embodiment having all-around gate dielectric layers and gate field plates according to one embodiment of the invention.

FIG. 5 shows a schematic cross-sectional diagram of semiconductor device according to one embodiment having all-around gate dielectric layers and gate field plates disposed below the gate finger bottoms and around gate fingers in the gate trenches. The field plates 003 are disposed aside the gate fingers and on top of surface passivation layers. The field plates can spread the electric field crowding near the edge of gate fingers on the drain side, such to mitigate heat crowding and prevent preliminary breakdown.

Figure 6:
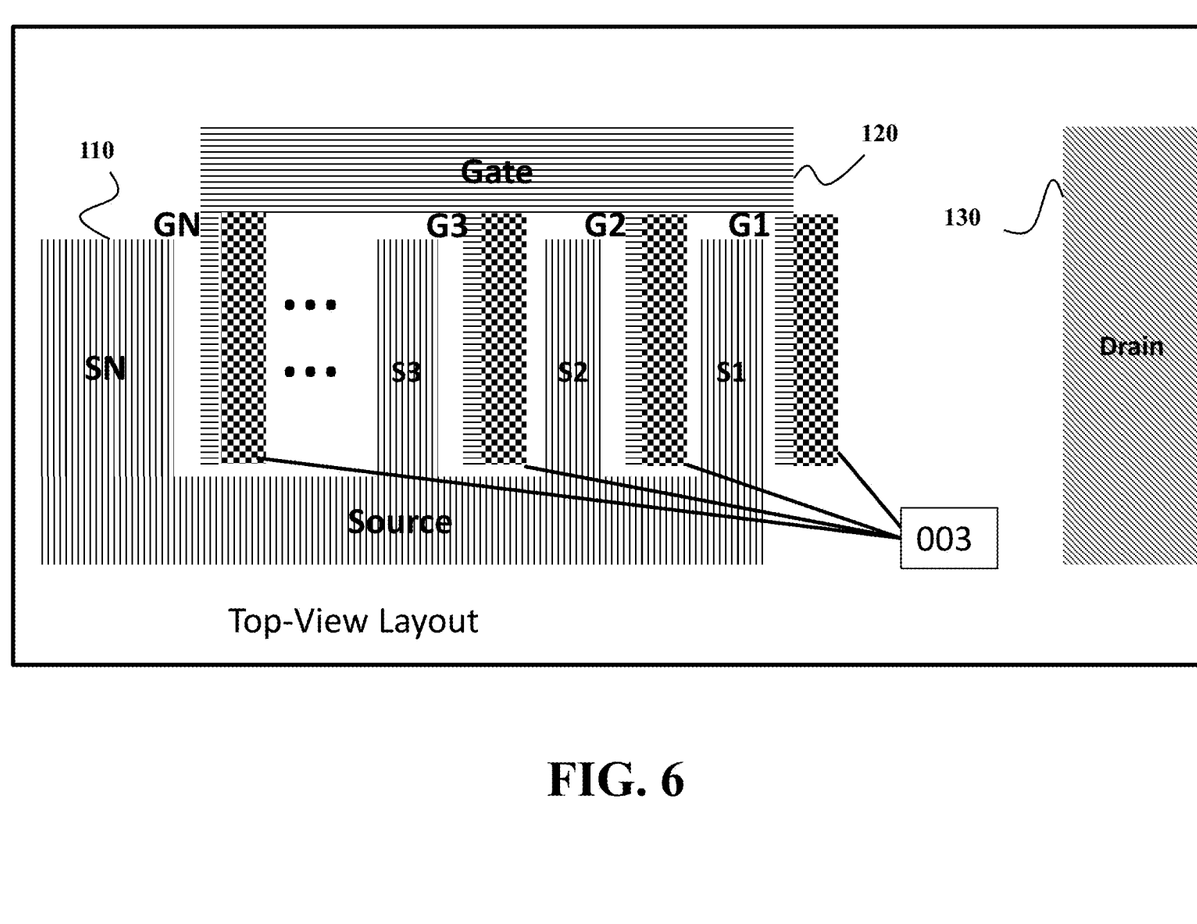
FIG. 6 is a top-view diagram of the embodiment of FIG. 5.

FIG. 6 shows a top-view diagram of the embodiment of FIG. 5. The top-view diagram shows a multi-channel heterostructure FET with all-around gate dielectric layers and gate field plates.

Figure 7:
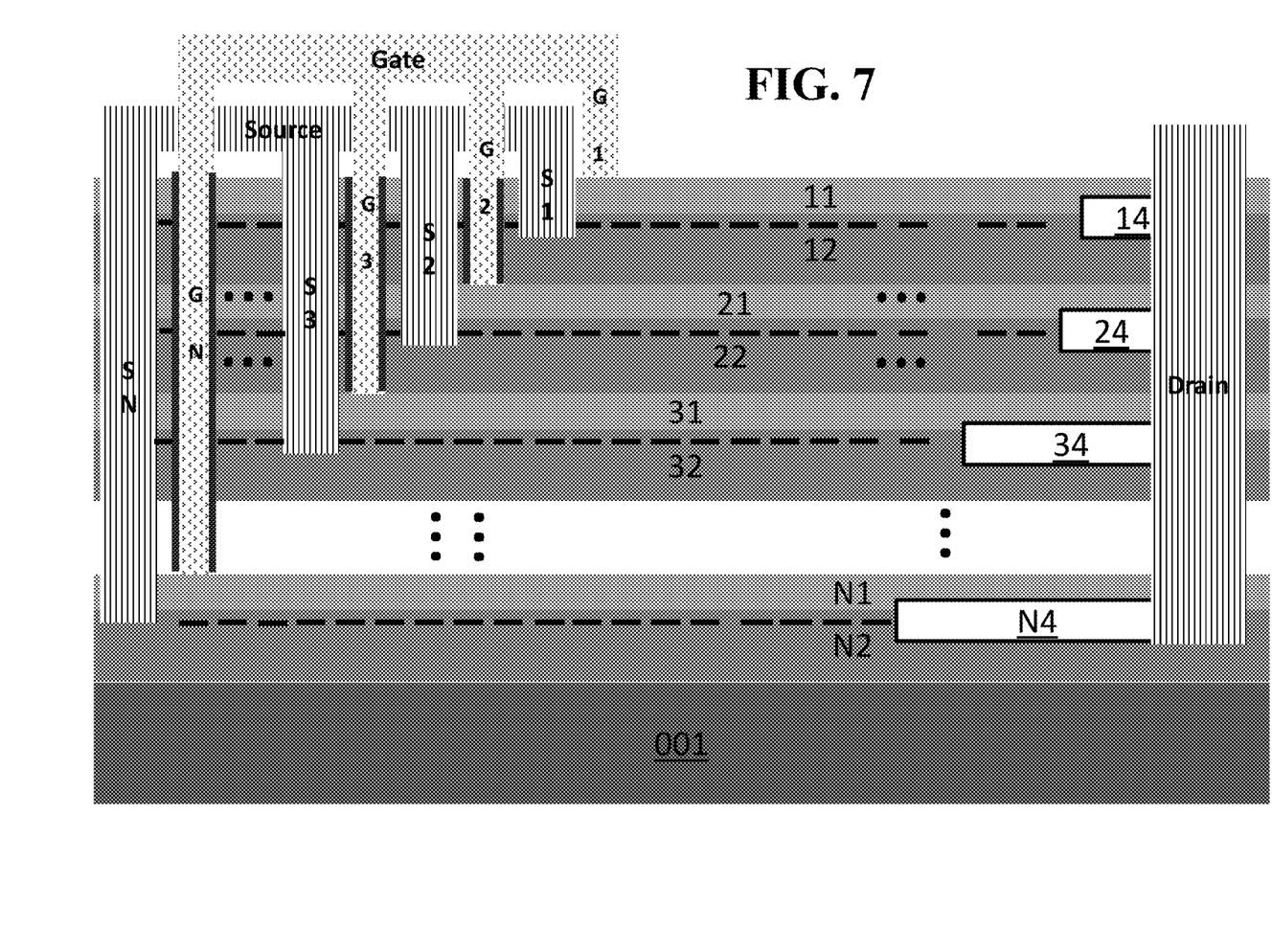
FIG. 7 is a schematic cross-sectional diagram of the semiconductor device according to another embodiment of the invention.

FIG. 7 shows a schematic cross-sectional diagram of the semiconductor device according to another embodiment of the invention. This embodiment includes heavily-doped regions 14, 24, 34 . . . N4 formed in the layered structure and connected to corresponding carrier channels. The additional regions can enable a same channel length (i.e. source-to-drain length) for all channels and eliminate possible frequency response dispersion of the said multi-channel FET due to uneven channel lengths.

The regions 14, 24, 34 . . . N4 are heavily doped with the same conductivity of the carrier channel. For example, in some embodiments with 2DEG channels, the regions 14, 24, 34 . . . N4 are heavily n-type doped. The lengths of the regions 14, 24, 34 . . . N4 are different and determined by distance between multiple source fingers, such to enable a same effective channel length for all channels. This multi-finger drain structure can be adopted for embodiments with relative small total channel length (so the channel length difference induced by interdigitated source and gate fingers cannot be neglected) for higher frequency response.

Figure 8:
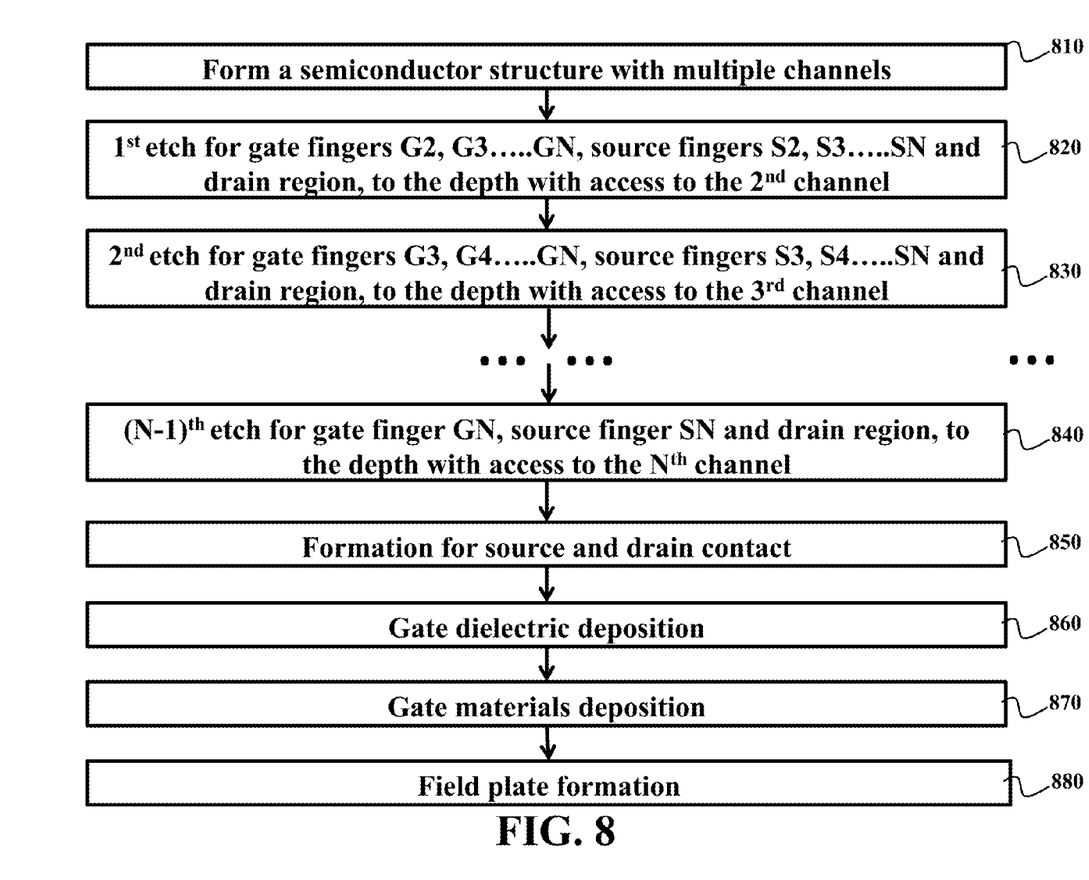
FIG. 8 is a block diagram of a method for fabricating a semiconductor device employing some principles of the embodiments of the invention.

FIG. 8 shows a block diagram of a method for fabricating a semiconductor device employing some principles of the embodiments of the invention. The method included forming 810, e.g., growing, a semiconductor structure forming, during the operation, multiple carrier channels. Various methods can be used for the growth and formation 810, including but not limiting to a Chemical Vapor Deposition (CVD), Metal-Organic Chemical Vapor Deposition (MOCVD), a Molecular Beam Epitaxy (MBE), a Metal-Organic Vapor Phase Epitaxy (MOVPE).

In the embodiments having doped regions, e.g., the regions 14, 24, 34 . . . N4, near the drain electrode, the partial doping can be realized by, e.g., a doping during the epitaxial growth followed by etching process to define doping regions and/or an ion implantation after the epitaxial growth with certain masks to define doping regions.

Next, the method etches space for the gate and source fingers of different depths. For example, the method $1^{st}$ etches 820 for gate fingers G2, G3 . . . GN, source fingers S2, S3 . . . SN and the drain region. The etch stop of $1^{st}$ etch is typically at the upper surface of layer 21 in some embodiments, while the etch stop can also reach inside layer 21 in some other embodiments.

For example, the etch stop can reach inside layer 21 for GaN-based heterostructure channels to realize a normally-off operation. In some embodiments, either physical or chemical methods are used for etching, including but not limiting to dry etch, wet etch, or a combination. Different ions for dry etching can be used, including but not limited to argon, fluorine, oxygen, hydrogen, nitrogen, chlorine or sulfur ions. In some embodiments, III-nitride layers can be etched using fluorine-based or chlorine-based plasma. For example, the dry etching can be steady for control to produce a smooth etching sidewall and induce minimum or no damage on the conductive buffer layers. Some embodiments of the method perform the $2^{nd}$ etch 830 for gate fingers G3, G4 . . . GN, source fingers S3, S4 . . . SN and drain region, with the etch stop on the surface of or reach inside layer 31. Subsequent steps 840 involve up to N etches for the gate fingers, source fingers and the drain region, with each depth equivalent to the depth of a periodic channel structure.

Next, the method forms 850 the source and the drain contacts and perform 860 the gate dielectric deposition. The gate dielectric can be disposed 860 using various methods can be used, including but not limit to Atomic Layer Deposition (ALD), MOCVD, Plasma-Enhanced Chemical Vapor Deposition (PECVD) etc. Next, the method deposes 870 the gate metals, e.g., 002, or other gate materials using, e.g., ebeam deposition, joule evaporation, chemical vapor deposition or sputtering process to form the gate. Next, for some embodiments, the method includes the formation 880 of gate field plates, e.g., 003.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A semiconductor device, comprising:
   a layered structure forming multiple carrier channels extending in parallel at different depths of the semiconductor device;
   a gate electrode having multiple gate fingers of different lengths penetrating the layered structure to reach and control corresponding carrier channels at the different depths; and
   a carrier electrode having multiple carrier fingers of different lengths penetrating the layered structure to access the corresponding carrier channels, wherein the carrier fingers are interdigitated with the gate fingers.

2. The semiconductor device of claim 1, wherein the carrier electrode is a source electrode for providing carrier charge to the multiple carrier channels or a drain electrode for receiving the carrier charge from the multiple carrier channels.

3. The semiconductor device of claim 1, wherein a carrier channel is a majority-carrier-channel or a minority-carrier-channel, wherein a carrier in the majority-carrier-channel includes electrons, and wherein the carrier in the minority-carrier-channel includes holes.

4. The semiconductor device of claim 1, wherein the carrier channels can be formed by one or combination of a p-n junction, a metal-semiconductor structure, a metal-oxide-semiconductor structure, a tunneling structure, a heterostructure, and a surface quantum well, and wherein materials of the layers of the layered structure forming the carrier channels include one or combination of compound semiconductors, a silicon, germanium, organic semiconductors, a diamond, a carbon nanotube, a graphene, a molybdenum disulfide, and a boron nitride.

5. The semiconductor device of claim 1, further comprising:
   gate dielectrics disposed at sidewalls of the gate fingers.

6. The semiconductor device of claim 1, wherein bottoms of at least some gate fingers have different distances to the corresponding carrier channels controlled by the gate fingers.

7. The semiconductor device of claim 6, further comprising:
   gate dielectrics disposed at bottoms of the gate fingers.

8. The semiconductor device of claim 1, further comprising:
   gate field plates disposed at the gate fingers.

9. The semiconductor device of claim 1, wherein each layer of the layered structure is partially heavily-doped enforcing a similar source-to-drain distance for the carrier channels.

10. The semiconductor device of claim 1, wherein the layered structure includes back-barrier layers to serve one or combination of etch stops, carrier confinements, and heat dissipation layers.

11. The semiconductor device of claim 1, wherein the layered structure includes a compound semiconductor and/or a diamond, wherein each carrier channel is a two-dimensional electron gas (2DEG) channel or a two-dimensional hole gas (2DHG) channel, wherein the 2DEG channel or 2DHG channel is formed in a heterostructure of the compound semiconductor or at a surface of the diamond.

12. The semiconductor device of claim 11, wherein the compound semiconductor is a III-nitride semiconductor, and the heterostructure includes a first and a second III-nitride layers, wherein the first III-nitride layer has a bandgap larger than a bandgap of the second III-nitride layer.

13. The semiconductor device of claim 12, wherein the first III-nitride layer is GaN and the second III-nitride layer is AlGaN, InAlN, InAlGaN or AlN.

14. A method for fabricating a semiconductor device, comprising:
   forming a layered structure enabling multiple carrier channels extending in parallel at different depths of the semiconductor device upon receiving a carrier charge;
   forming trenches in the layered structure for multiple fingers of a gate electrode and a carrier electrode, wherein the trenches for the fingers of the gate electrode and the carrier electrode are of different length to access the corresponding carrier channels at the different depths; and
   forming the gate electrode and the carrier electrode such that the fingers of the carrier electrode are interdigitated with the fingers of the gate electrodes.

15. The method of claim 14, wherein the trenches are etched in the layered structure.

16. The method of claim 14, further comprising:
   selecting the lengths of the fingers of the gate electrode to reach and control the corresponding carrier channels; and
   selecting the lengths of the fingers of the carrier electrode to access the corresponding carrier channels.

17. The method of claim 14, further comprising:
   providing a second carrier electrode is provided to be common for all carrier channels.

18. The method of claim 14, further comprising:
   partially heavily-doping each layer of the layered structure, wherein the lengths of heavily-doped regions differ for different layers to provide an identical source-to-drain distance for all carrier channels.

19. The method of claim 14, further comprising:
   depositing gate dielectrics and field plate near the gate fingers.

20. The method of claim 14, wherein the trenches are formed using etch-stop layers.

* * * * *